United States Patent [19]

Sato

[11] Patent Number: 5,763,018
[45] Date of Patent: Jun. 9, 1998

[54] METHOD FOR FORMING DIELECTRIC LAYER

[75] Inventor: Junichi Sato, Tokyo, Japan

[73] Assignee: Sony Corporation, Japan

[21] Appl. No.: 654,523

[22] Filed: May 29, 1996

[30] Foreign Application Priority Data

Jun. 20, 1995 [JP] Japan ................... 7-176789

[51] Int. Cl.$^6$ ....................... B05D 3/06
[52] U.S. Cl. .................. 427/535; 427/579; 427/560; 427/600; 427/255; 427/255.1; 427/255.2; 427/255.3; 427/255.7; 438/788; 438/789; 438/790
[58] Field of Search ............ 427/579, 255.3, 427/255.2, 560, 535, 255.7, 255.1, 255, 600; 437/238; 438/788, 789, 790

[56] References Cited

U.S. PATENT DOCUMENTS 5,314,724  5/1994  Tsukune et al. ............. 427/489
5,462,899  10/1995  Ikeda ........................ 437/238
5,525,550  6/1996  Kato ......................... 437/238

FOREIGN PATENT DOCUMENTS 7-029902  1/1995  Japan.

Primary Examiner—Roy V. King
Attorney, Agent, or Firm—Ronald P. Kananen

[57] ABSTRACT

A dielectric layer is formed on a semiconductor substrate by the steps of depositing water molecules and plasma-dissociated products of water on a dielectric layer-forming surface of a substrate according to a plasma enhanced CVD process, and forming a dielectric layer on the dielectric layer-forming surface of the substrate according to a CVD process using a silicon-containing gas and an oxidant as starting gases. Alternatively, water molecules alone may be deposited on the dielectric layer-forming surface according to a normal or reduced pressure CVD process used in placed of the above-mentioned CVD process. By this, the dielectric layer becomes so fluid that a final layer is free of any void and flat. In addition, the dielectric layer having a low concentration of hydroxyl group therein with a good quality can be formed at high productivity.

17 Claims, 2 Drawing Sheets

F I G. 3A
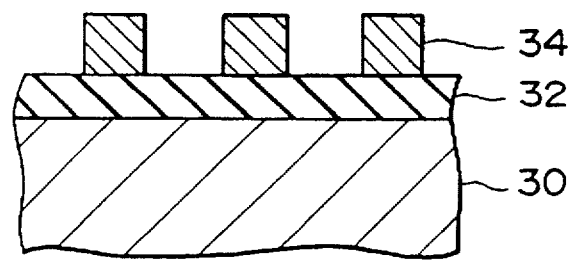
F I G. 3B
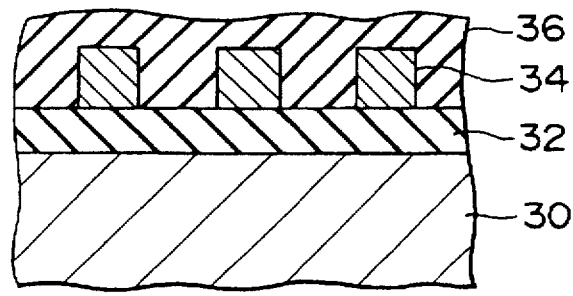

METHOD FOR FORMING DIELECTRIC LAYER

BACKGROUND OF THE INVENTION

This invention relates to a method for forming a dielectric layer of semiconductor devices, particularly formed between interconnection layers. More particularly, the invention relates to a method for forming a flat dielectric layer of good quality on Al interconnection layers during the course of the fabrication of highly fine and highly integrated semiconductor integrated circuits such as memories.

As semiconductor devices become more integrated in higher density, the interconnection structure tends toward greater fineness in a more multi-layered fashion. However, the fine and multi-layered interconnection structure will, in turn, cause the reliability of semiconductor devices to lower. This is because the fineness and multi-layering of the interconnection structure brings about a great and sharp step of a dielectric layer. The processing accuracy of the Al interconnections formed on the dielectric layer lowers, with the result that the reliability of the interconnections undesirably lowers.

Because it is technically difficult at present to develop a technique of forming an Al layer so as to remarkably improve the step coverage of the Al interconnection layers, the dielectric layer has to be improved in flatness for the purpose of enhancing the reliability of the interconnections. The improvement in the flatness of the dielectric layer is now assuming importance from the standpoint that the focal depth lowers owing to the use of a shorter wavelength in photolithography.

Up to now, there have been developed a number of techniques of forming and flattening dielectric layers. This is summarized in Table 1 below.

TABLE 1

Techniques of Forming and Flattening Dielectric Layers

| Method | Principle | Advantages and Features |
|---|---|---|
| CVD of organic silanes | plasma CVD | process that is predominant of surface reactions | good quality of film which is close to a conformal geometry |
| | reduced pressure CVD | | conformal geometry |
| | normal pressure CVD | | flow geometry filling a narrow gap |
| processing and shape adjusting | bias sputtering bias ECR CVD | sputter etching is conducted to round off sharp edges simultaneously with the film formation | simple (the film is flattened simultaneously with the film formation) |
| Coating | inorganic SOG organic SOG | collected in recesses more thickly owing to the use of a liquid composition | simple in process, great in capacity capable of being coated in a thickness greater than in the inorganic SOG |
| | organic resin | | simple in process, low in dielectric constant |
| Reflowing | high temperature thermal | softened by the thermal treatment | simple in process |

TABLE 1-continued

Techniques of Forming and Flattening Dielectric Layers

| Method | Principle | Advantages and Features |
|---|---|---|
| Etching back | treatment (sputter) etching back | sharp edges rounded off by (sputter) etching back | simple in process |
| | masking material | masking material (resist) is coated, and the resultant flat surface is etched back | wide in utility |

If these techniques have been applied to the formation of a dielectric layer in fine, multi-layered interconnection structures, the following problems arise. One of such problems is that the thickness of the dielectric layer depends greatly on the pattern. More particularly, where a dielectric layer is formed on interconnection layers, a portion of the dielectric layer formed on the region of the interconnection layers in which the distance between the interconnections along the horizontal direction is wide becomes low with respect to the level of the layer surface. On the other hand, with a portion of the dielectric layer formed on the region of the interconnection in which the distance between the interconnections along the horizontal direction is narrow, the surface level of this portion becomes high. As a consequence, the difference between the levels at the regions of the dielectric layer becomes so great that the flatness of the dielectric layer degrades as a whole. If a multi-layered structure is formed, interconnection layers and a dielectric layer formed on an initial dielectric layer further degrade in the flatness. Upper interconnection layers and dielectric layer becomes more worsened in flatness.

Another problem is that, as shown in FIG. 1, voids are formed as 2 between adjacent interconnections in a dielectric layer 3 formed on Al interconnection layers 1. This entails a lowering of insulation between the interconnections.

As one of methods of forming a flat dielectric layer 3, attention has now been paid to a method wherein organic silane such as TEOS is provided as a starting gas and is converted to an oxide film according to a CVD method.

The oxide film formed in this reaction system is so high in fluidity and it has the capability of self-flowing. Accordingly, the gap fill becomes fine in width and the oxide film surface is flattened, thereby forming a flat dielectric layer which is substantially free of any voids as shown in FIG. 1. The CVD method using organic silanes can be broadly classified into a normal pressure CVD method and a plasma enhanced CVD method depending on the difference in designing of reaction. A diversity of studies and developments in the respective CVD methods have been conducted in order to improve the film quality.

For instance, a method for forming a flattened dielectric layer having a low content of hydroxyl group has been proposed as the normal pressure CVD method. In this method, an organic silane and an inorganic acid are employed as a source gas, and hydrolysis is caused to proceed in the oxide film while forming the oxide film, thereby reducing the content of hydroxyl group in the film (Japanese Patent Laid-open No. Hei 3-116853). However, the method may be disadvantageous in that because the flown shape of the oxide film depends greatly on the type of base, thus being short of the stability and reliability of the process.

As the plasma enhanced CVD method, there has been proposed a method of forming a dielectric layer using, as a starting gas, an organic silane to which water is added. In this method, it is stated that surface wettability is enhanced by the action of water deposited on a dielectric layer-forming surface, and thus, the dielectric layer is likely to flow, with the result that a flat dielectric layer is formed as being free of any voids when formed on Al interconnection layers having a high aspect ratio. In this method, the substrate is homogenized owing to the plasma ion energy, and the dependence of the flow behavior on the substrate is low, unlike the above-stated normal pressure CVD method. It will be noted that the concentration of hydroxyl group in the layer is relatively high.

When using the above related art methods of forming the dielectric layer, limitation is placed on the gap fill characteristic. This makes it difficult to flatten a dielectric layer of next generation semiconductor devices whose aspect ratio is great as corresponding to an interconnection width of 0.5 μm or below.

For a method of forming a dielectric film having a good gap fill characteristic, there has been proposed a method wherein a dielectric layer is formed according to a normal pressure or reduced pressure CVD process using TEOS/$H_2O_2$ gases as starting gases. In this method, the surface on which a dielectric layer is to be formed is wetted owing to the water produced from $H_2O_2$, and thus, a formed dielectric film is likely to flow. At the same time, TEOS is oxidized with $O_3$ and $O_2$ generated from $H_2O_2$, thereby forming a $SiO_2$ film. However, the method has the problem that the water is taken in the film to increase the concentration of hydroxyl group in the film, thereby causing the film quality to lower.

Another method of forming a flat dielectric film on interconnection layers having a width therebetween of 0.5 μm or below has been proposed, which is a bias/ECR/CVD process wherein an etching reaction and a film-formation reaction are competed with each other. This method has the problem that the throughput is so small that productivity is not good.

OBJECTS AND SUMMARY OF THE INVENTION

An object of the invention is to provide a method for forming a dielectric layer which has a low concentration of hydroxyl group therein and a good quality.

Another object of the invention is to provide a method for forming a dielectric layer at high productivity, which has a good gap fill characteristic and which is likely to be flattened.

We made studies on a method for forming a dielectric layer from above-mentioned TEOS/$H_2O_2$ starting gases and investigated why the concentration of hydroxyl group in the resulting dielectric layer became high. As a result, it was found that the high concentration resulted from the constant feed of $H_2O_2$. More particularly, the constant feed of $H_2O_2$ is substantially the same as the case where water is invariably added to the starting gas. The water is taken in the dielectric layer or film, thereby increasing the concentration of hydroxyl group in the layer.

On the other hand, as will be apparent from the method of forming an $O_3$/TEOS CVD film according to the normal pressure CVD process, when an organic solvent is applied to the dielectric layer-forming surface prior to the formation of the dielectric layer, the surface is rendered hydrophilic and the fluidity of the applied dielectric layer increases.

We have applied this principle to the formation of a dielectric layer from a mixture of a silicon-containing compound and an oxidant. More particularly, it is our position that the surface treatment with water is carried out prior to the formation of the dielectric layer, by which the surface is rendered hydrophilic to impart good wettability to the surface of the substrate thereby increasing the fluidity of the insulating film. Moreover, it has also been conceived that the treatment of the substrate with water is effected prior to the formation of the dielectric layer and that during the course of the film formation, any water is not added to a starting gas or gases, unlike the TEOS/$H_2O_2$ process, so that the concentration of hydroxyl group in the layer does not increase.

More particularly, we intended to achieve the above objects in the following manner: when the dielectric layer is formed from an organic silane compound and an oxidant, a substrate is initially treated with water on the surface thereof, followed by formation of the dielectric layer. We experimentally confirmed optimum conditions therefor through a series of experiments, and the invention was accomplished based on the results of the experiments.

According to the invention, there is provided a method for forming a dielectric layer on a semiconductor substrate, the method comprising the steps of:

depositing water molecules and plasma-dissociated products of water molecules on one side of the substrate, on which a dielectric layer is to be formed, according to a plasma enhanced CVD process; and forming a dielectric layer on the one side of the substrate from a silicon-containing gas and an oxidant according to a CVD process.

In the first step of the method of the invention, the plasma enhanced CVD process is used. This is because plasma-dissociated products of water are produced by the action of the plasma and are deposited on the substrate surface, which is very effective in improving the surface wettability.

The step of depositing the water molecules and the dissociated products of water molecules according to the plasma enhanced CVD process is carried out by use of a plasma enhanced CVD apparatus, preferably under conditions of a pressure ranging from 1.33 Pa to 50 Pa, a temperature ranging from 50° C. to 100° C., a flow rate of $H_2O$ ranging from 20 sccm to 100 sccm, a high frequency output density ranging from 0.01 to 0.1 W/cm², and a treating time ranging from 30 seconds to one minute.

The step of forming the dielectric layer is carried out under ordinary film-forming conditions according to a normal pressure CVD process, reduced pressure CVD process or plasma enhanced CVD process. Accordingly, the productivity for the formation of dielectric layer can be maintained at the same level as in related art without presenting any problem of productivity as will be experienced in the afore-stated Bias/ECR/CVD method.

According to another embodiment of the invention, there is also provided a method for forming a dielectric layer on a semiconductor substrate which comprises the steps of:

depositing water molecules on one side of a substrate on which a dielectric layer is to be formed, according to a normal pressure CVD process or reduced pressure CVD process; and forming the dielectric layer on the one side of the substrate according to a CVD process using starting silicon-containing gas and oxidant.

Where water molecules are deposited according to a normal pressure CVD process, a normal pressure CVD apparatus is used, and preferred conditions include a normal pressure, a temperature ranging from 50° C. to 100° C., a flow rate of $H_2O$ ranging from 100 sccm to 500 sccm, and a treating time ranging from 30 seconds to one minute. On the other hand, where water molecules are deposited according to a reduced pressure CVD process, a reduced pressure CVD apparatus is used, and preferred conditions include a pressure ranging from 13.3 Pa to 80 Pa, a temperature ranging from 50° C. to 100° C., a flow rate of $H_2O$ ranging from 50 sccm to 300 sccm, and a treating time ranging from 30 seconds to one minute.

The silicon-containing gas used in the invention is not critical and preferably include tetraethoxy orthosilane (hereinafter referred to simply as TEOS), octamethylcyclotetrasiloxane (hereinafter abbreviated as OMCTS), tetrapropoxysilane (hereinafter abbreviated as TPOS), and tetramethylcyclotetrasiloxane (hereinafter abbreviated as TMCTS).

The oxidant useful in the invention is not critical and preferably includes oxygen, ozone, oxygen nitride or the like.

According to a further preferred embodiment of the invention, a basic gas serving as a catalyst for the reaction between the silane and the oxidant is added to the starting gas consisting of the silicon-containing gas and the oxidant. Examples of the basic gas include ammonia, lower alkylamines and the like.

Examples of the lower alkylamine include alkylamines having lower alkyl groups such as methylamine, ethylamine, isopropylamine and the like. The addition of the basic reaction catalyst gas permits the dehydration and condensation reactions of the organic silicon compound to proceed smoothly, thereby obtaining a film or layer having a low concentration of hydroxyl group.

According to another preferred embodiment of the invention, there is provided a method for forming a dielectric layer on one side of a substrate according to a CVD process using a silicon-containing gas and an oxidant as starting gases, characterized in that the substrate is applied with a ultrasonic wave during the formation of the layer.

The ultrasonic wave being applied should preferably have a frequency ranging from 20 kHz to 80 kHz and an output power ranging from 50 W to 300 W. When a ultrasonic wave is applied to part of a CVD apparatus, preferably to a susceptor on which the substrate is mounted, during the course of the film formation, the ultrasonic energy is transmitted to the substrate. As a result, the reaction species during the course of the film formation are more likely to flow, thereby forming a void-free, flat dielectric layer. The application of the ultrasonic wave contributes to the reduction in amount of the hydroxyl group in the layer.

BRIEF DESCRIPTION OF THE DRAWINGS

FIGS. 3a and 3b are, respectively, schematic sectional views of a substrate obtained in the respective steps of a method of the invention.

DETAILED DESCRIPTION OF THE PREFERRED EMBODIMENTS

The invention is described in more detail with reference to the accompanying drawings which illustrate embodiments of the invention.

Figure 1:
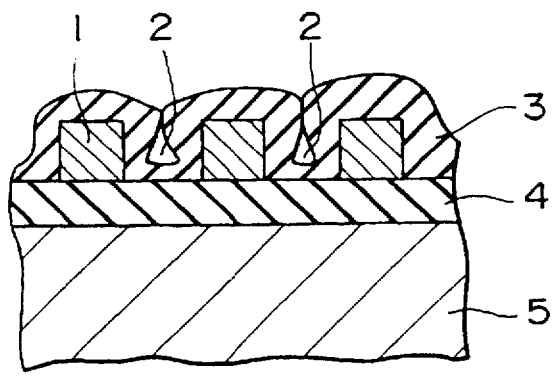
FIG. 1 is a schematic sectional view illustrating defects produced in a dielectric layer formed by a related art method.
Figure 2:
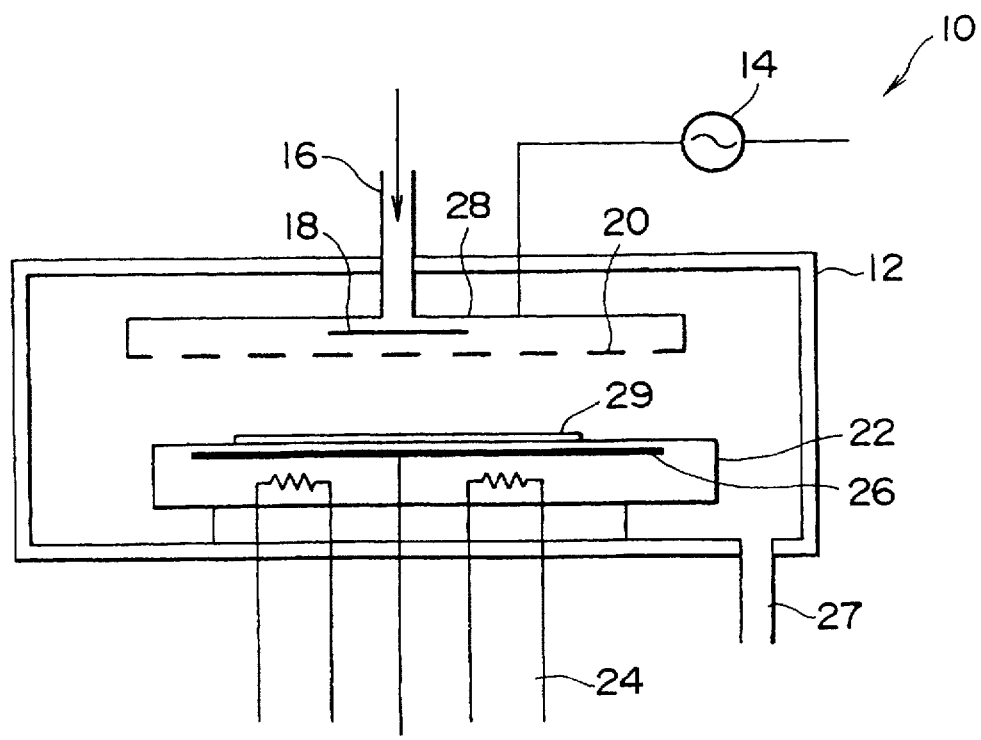
FIG. 2 is a schematic view showing an arrangement of a plasma enhanced CVD apparatus for carrying out a method of the invention.

FIG. 2 is a schematic sectional view showing an arrangement of a plasma enhanced CVD apparatus for carrying out a first example of a method of the invention. A plasma enhanced CVD apparatus 10 (hereinafter referred to simply as apparatus 10) includes a reaction chamber 12 and a high frequency power supply 14.

A pipe 16 for feeding a silicon-containing compound such as TEOS, an oxidant such as ozone and water vapor from the direction indicated by the arrow is connected at an upper portion of the reaction chamber 12.

A dispersion plate 18 is provided at the upper portion of the reaction chamber 12 so that the gases fed into the reaction chamber 12 are uniformly dispersed to ensure good in-plane uniformity. A shower head 20 is provided at the tip of the pipe 16 for jetting the gas in a downward direction.

A susceptor 22 is provided at the lower portion within the reaction chamber 12 on which a wafer 29 is mounted in order to form a dielectric layer thereon. A heater 24 for keeping the wafer 29 at a given reaction temperature and a ultrasonic wave applicator 26 for applying a ultrasonic wave to the wafer 29 are built in the susceptor 22. The ultrasonic applicator 26 is transmitted with a ultrasonic waver from a ultrasonic generator (not shown) provided at the outside of the reaction chamber.

The reaction chamber 12 is connected through an exhaust pipe 27 to an outside vacuum device (not shown) and is kept at a given reduced pressure level. The shower head 20 also serves as an upper electrode and is applied with a high frequency of 13.56 MHz from the high frequency power supply 14. As a result, a glow discharge takes place in association with the susceptor 22 thereby causing a plasma to generate in the space of the reaction chamber 12.

Water vapor is produced by vaporizing pure water in a vapor generator (not shown) provided at the outside of the reaction chamber 12. This vapor is introduced into the reaction chamber 12 through the pipe 16 along with the silicon-containing compound and the oxidant gas.

The arrangement for mounting the wafer and the manner in use of the apparatus 10 are not critical and may be varied or modified without departing from the scope of the invention.

A second example of the invention is described in detail.

In this example, the method of the invention is applied to the formation of a flat dielectric layer on an Al interconnection layer. As shown in FIG. 3a, a wafer was provided as a sample which included a $SiO_2$ dielectric layer 32 formed on a silicon semiconductor substrate 30, and Al interconnection layers 34 formed on the dielectric layer 32. The Al interconnection layers 34 individually had a width of 0.35 µm, a distance between adjacent interconnections of 0.40 µm, and a thickness of 0.40 µm. The sample was set in the apparatus 10 shown in FIG. 2, and a dielectric layer 36 was formed according to the method of the invention as shown in FIG. 3b.

For the formation of the dielectric layer 36, the step of increasing surface wettability was carried out in the following manner. While water vapor was introduced through the pipe 16 to the reaction chamber 12 of the apparatus 10, a RF voltage was applied to under the following conditions thereby generating a plasma. Eventually, water molecules and plasma-dissociated products of water were deposited on the surface of the water on which the dielectric layer was to be formed.

Treating time: 30 seconds

Gas flow rate: $H_2O$=50 sccm

Pressure: 40 Pa

Temperature: 50° C.

RF power density: 0.05 W/cm$^2$

After the water vapor was stopped from feeding, TEOS and ozone which were, respectively, used as a silicon-containing gas and an oxidant were introduced into the reaction chamber 12, followed by forming an oxide film according to the plasma enhanced CVD process under the following conditions.

Film thickness: 600 nm

Gas flow rate: TEOS/O$_3$=150 sccm/100 sccm

Pressure: 40 Pa

Temperature: 100° C.

RF power density: 0.05 W/cm$^2$

In order to evaluate the oxide film obtained in this example, the section of the film was observed through SEM for determination of a gap fill characteristic thereof, with the result that it was as good as in the case of the TEOS/H$_2$O$_2$ method. Moreover, the concentration of hydroxyl group in the oxide film was measured according to the FTIR method, revealing that the concentration was much lower than that of the oxide film obtained by the TEOS/H$_2$O$_2$ method and no peak of —OH was observed.

A third example of the invention is described in detail.

In this example, the method of the invention is applied to the formation of a flat dielectric layer on an Al interconnection layer, like the second example. A wafer sample as used in Example 2 was subjected to a plasma treatment of a base surface with water vapor in the same manner as in Example 2. The oxide film-forming step differed from that of Example 2 in that ammonia was added as a basic catalyst gas to the TEOS and ozone, followed by film formation under the following conditions.

Film thickness: 600 nm

Gas flow rate: TEOS/O$_3$/NH$_3$=150 sccm/100 sccm/15 sccm

Pressure: 40 Pa

Temperature: 100° C.

RF power density: 0.05 W/cm$^2$

In order to evaluate the oxide film obtained in this example, the gap fill characteristic of the oxide film formed on the wafer was observed through the SEM of the section, with the result that it was as good as in the case of the TEOS/H$_2$O$_2$ method. Moreover, the concentration of hydroxyl group in the oxide film was measured according to the FTIR method, revealing that the concentration was lower than that of the oxide film of Example 2 and no peak of —OH was observed.

A fourth example of the invention is described in detail.

In this example, the method of the invention is applied to the formation of a flat dielectric layer on an Al interconnection layer as in Example 2. A wafer sample as used in Example 2 was provided and subjected to a plasma treatment of a base surface with water vapor and oxide film formation with TEOS and ozone under the same conditions as in the second example. In addition, a ultrasonic wave of 50 kHz from the ultrasonic applicator 26 of the apparatus 10 was applied to the wafer at an output of 100 W during the oxide film formation step.

In order to evaluate the oxide film obtained in this example, the gap fill characteristic of the oxide film formed on the wafer was observed through the SEM of the section, revealing that this characteristic was better than that of the oxide film of Example 2. More particularly, the gap between the interconnections having a great aspect ratio was fully filled without any void. Thus, the fluidity of the oxide film-forming material was improved by the application of the ultrasonic wave.

Moreover, the measurement of a concentration of hydroxyl group in the oxide film by the FTIR method revealed that it was better than that of the oxide film obtained in Example 2, with any —OH peak being not observed.

From the results of the foregoing example, it will be seen that the oxide films obtained in Examples 2 to 4 ensure good fluidity and good coverage, and have a low concentration of hydroxyl group in the film with a good quality. Thus, according to the invention, a dielectric layer having a good gap fill characteristic and a good quality can be formed on an Al interconnection layer having a width between the interconnections of 0.35 µm and a high aspect ratio.

In the foregoing description, the method of the invention has been illustrated using a plasma enhanced CVD method. Of course, the method can be carried out using a normal pressure or reduced pressure CVD method. Further, Examples 2 to 4 are shown to particularly illustrate the invention and should not be construed as limiting the invention thereto. The structure of the apparatus, treating conditions, and film-forming conditions may be varied and modified without departing from the scope of the invention.

Once again, the method of the invention is effective in forming a dielectric layer on a semiconductor substrate, in which water molecules and/or plasma-dissociated products of water molecules are deposited, prior to the formation of a dielectric layer, on a dielectric layer-forming surface of a substrate according to the CVD enhanced CVD process, normal pressure CVD process or reduced pressure CVD process. By this, the fluidity of the dielectric layer is increased to form, at high productivity, a void-free, flat dielectric layer which has a low concentration of hydroxyl group in the layer with a good quality. Even when a multi-layered interconnection structure having a width of interconnection of 0.5 µm or below is formed, the reliability of the interconnection structure can be improved according to the method of the invention. According to the method of the invention, there can be fabricated ULSI's (Ultra Large Scale Integrated Circuit) provided with a highly reliable interconnection structure at high productivity and in high yield.

Moreover, when a basic gas serving as a catalyst for the reaction is added to starting gases or when a ultrasonic wave is applied to a wafer, a flat dielectric layer with better quality can be formed.

What is claimed is:

1. A method for forming a dielectric layer on a semiconductor substrate, the method comprising the steps of:

depositing water molecules and plasma-dissociated products of water molecules on one side of said substrate, on which the dielectric layer is to be formed, according to a plasma enhanced CVD process; and then forming the dielectric layer on the one side of said substrate according to a CVD process using a silicon-containing gas and an oxidant as a starting gas.

2. A method according to claim 1, wherein said silicon-containing gas is a member selected from the group consisting of tetraethoxy ortho-silane, octamethylcyclotetrasiloxane, tetrapropoxysilane, and tetramethylcyclotetrasiloxane.

3. A method according to claim 1, wherein said oxidant is a member selected from the group consisting of ozone, oxygen and oxygen nitride.

4. A method according to claim 1, wherein a basic gas used as a catalyst for reaction and selected from the group consisting of ammonia and lower alkylamines is added to the starting gas consisting of the silicon-containing gas and the oxidant.

5. A method for forming a dielectric layer on a semiconductor substrate, the method comprising the steps of:

depositing water molecules and plasma-dissociated products of water molecules on one side of said substrate, on which the dielectric layer is to be formed, according to a plasma enhanced CVD process;

applying an ultrasonic wave to said substrate by means of an ultrasonic wave applicator; and then forming the dielectric layer on the one side of said substrate according to a CVD process using a silicon-containing gas and an oxidant as a starting gas while applying said ultrasonic wave to said substrate.

6. A method according to claim 5, wherein said silicon-containing gas is a member selected from the group consisting of tetraethoxy ortho-silane, octamethylcyclotetrasiloxane, tetrapropoxysilane, and tetramethylcyclotetrasiloxane.

7. A method according to claim 5, wherein said oxidant is a member selected from the group consisting of ozone, oxygen and oxygen nitride.

8. A method according to claim 5, wherein a basic gas used as a catalyst for reaction and selected from the group consisting of ammonia and lower alkylamines is added to the starting gas consisting of the silicon-containing gas and the oxidant.

9. A method for forming a dielectric layer on a semiconductor substrate, the method comprising the steps of:

depositing water molecules on one side of said substrate, on which the dielectric layer is to be formed, according to a normal or low pressure CVD process, according to a normal or reduced pressure CVD process; and then forming the dielectric layer on the one side of said substrate according to a CVD process using a silicon-containing gas and an oxidant as a starting gas.

10. A method according to claim 9, wherein said silicon-containing gas is a member selected from the group consisting of tetraethoxy ortho-silane, octamethylcyclotetrasiloxane, tetrapropoxysilane, and tetramethylcyclotetrasiloxane.

11. A method according to claim 9, wherein said oxidant is a member selected from the group consisting of ozone, oxygen and oxygen nitride.

12. A method according to claim 9, wherein a basic gas used as a catalyst for reaction and selected from the group consisting of ammonia and lower alkylamines is added to the starting gas consisting of the silicon-containing gas and the oxidant.

13. A method according to claim 9, wherein said CVD is carried out under reduced pressure ranging from about 1 Pa to about 80 Pa.

14. A method for forming a dielectric layer on a semiconductor substrate, the method comprising the steps of:

depositing water molecules on one side of said substrate, on which the dielectric layer is to be formed, according to a normal or low pressure CVD process;

applying an ultrasonic wave to said substrate by means of an ultrasonic wave applicator; and then forming the dielectric layer on the one side of said substrate according to a CVD process using a silicon-containing gas and an oxidant as a starting gas while applying said ultrasonic wave to said substrate.

15. A method according to claim 14, wherein said silicon-containing gas is a member selected from the group consisting of tetraethoxy ortho-silane, octamethylcyclotetrasiloxane, tetrapropoxysilane, and tetramethylcyclotetrasiloxane.

16. A method according to claim 14, wherein said oxidant is a member selected from the group consisting of ozone, oxygen and oxygen nitride.

17. A method according to claim 14, wherein a basic gas used as a catalyst for reaction and selected from the group consisting of ammonia and lower alkylamines is added to the starting gas consisting of the silicon-containing gas and the oxidant.

* * * * *